United States Patent

Weigert

[11] 3,934,241
[45] Jan. 20, 1976

[54] ANALOG DISPLAY UTILIZING LIQUID CRYSTAL MATERIAL AND FOR BEING MULTIPLEXED WHEREIN ONE GROUP OF ELECTRODES ARE ARRANGED OPPOSITE A GROUP OF COUNTER-ELECTRODES

[75] Inventor: Hans Weigert, Woodcliff Lake, N.J.

[73] Assignee: Ragen Precision Industries, Inc., North Arlington, N.J.

[22] Filed: Nov. 13, 1974

[21] Appl. No.: 523,341

[52] U.S. Cl. ........ 340/324 R; 58/128; 315/169 TV; 340/166 EL; 350/160 LC
[51] Int. Cl.[2] ........................................... G02F 1/18
[58] Field of Search ..... 340/324 R, 324 M, 166 EL, 340/336; 350/160 LC; 58/128; 315/169 TV

[56] References Cited
UNITED STATES PATENTS

| | | | |
|---|---|---|---|
| 3,525,091 | 8/1970 | Lally | 340/324 R |
| 3,781,587 | 12/1973 | Lustig et al. | 315/169 TV |

Primary Examiner—Marshall M. Curtis
Attorney, Agent, or Firm—Popper & Bobis

[57] ABSTRACT

Analog display utilizing liquid crystal material and for being multiplexed wherein the segments (one group of electrodes) are arranged in groups opposite sectors (the counter electrodes) and wherein the segments in each group are disposed in a sequence opposite to the sequence in which the segments of the next adjacent group are disposed and, further, wherein a segment in each group corresponds to a segment in each other group and wherein all corresponding segments are electrically interconnected in a series connection. In timed sequence with the input signals applied to the sectors, input signals are applied to the segments in a first predetermined sequence with regard to a direction of display movement to be provided by the display, and alternately, the input signals are applied to the segments in an opposite sequence with regard to the direction of display movement whereby the display movement is in one continuous direction. The disposition of the segments in groups wherein the segments in adjacent groups are disposed oppositely, and the series connection of corresponding segments, permits the leads to the segments to be made by such techniques as evaporation, sputtering, photo-masking or etching by eliminating the cross-overs which are costly to accommodate. Still further, the analog display of the present invention provides a display having a minimum of input leads thereby greatly reducing the possibility of failure points since each input point is a potential failure point and each elimination of an input point is the elimination of a potential failure point.

3 Claims, 4 Drawing Figures

ANALOG DISPLAY UTILIZING LIQUID CRYSTAL MATERIAL AND FOR BEING MULTIPLEXED WHEREIN ONE GROUP OF ELECTRODES ARE ARRANGED OPPOSITE A GROUP OF COUNTER-ELECTRODES

BACKGROUND OF THE INVENTION

As is known to those skilled in the art of producing electrodes and leads by evaporation, sputtering, photo-masking and etching the problem of cross-over points is one that persists and perplexes and causes highly undesirable costs since each crossover point requires insulation with its attendant expense. Further, as is also known to those skilled in the art, each input point to electrical apparatus, such as a liquid crystal display, is a potential trouble point and thus the elimination of input points is an elimination of potential trouble points, and accordingly, it is most desirable to provide electrical apparatus, such as a liquid crystal display, with a minimum of electrical input points.

SUMMARY

The present invention overcomes the above-noted prior art cross-over and minimization of electrical input points with regard to analog liquid crystal displays for being multiplexed, by first arranging the segments (one set of electrodes) in a plurality of adjacent groups and by interconnecting the corresponding segments in each group in a series electrical connection whereby only one input point is required for each segment series interconnection—thereby eliminating cross-overs and also providing a minimum of electrical input points. The segments in each group are arranged in a sequence opposite to the segments in the next adjacent group and, in accordance with the present invention, the input signals to the segments are first provided in one sequence with regard to the desired direction of display movement and alternately the input signals to the display are provided to the segments in the opposite sequence with regard to the desired direction of display movement whereby the display movement may be provided in one direction continously.

DESCRIPTION OF THE INVENTION

The embodiment of the present invention shown in the FIGS. and described below is structured circularly as an analog display for a timepiece such as a wristwatch, however, the present invention is not so limited and may be embodied in many other geometric shapes such as for example a bargraph for displaying time, temperature or other functions.

Figure 1:
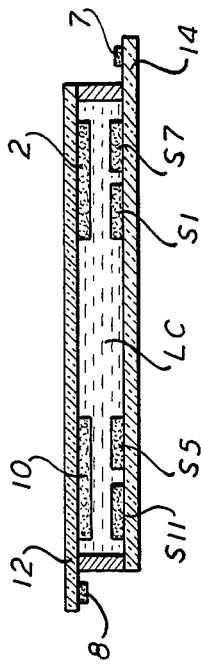
FIG. 1 is a diagrammatic view, generally in cross-section, of an analog liquid crystal display for being multiplexed and structured in accordance with the present invention.

Referring to FIG. 1, there is shown a plurality of segments (electrodes), represented by segments 10 and 2 which may be provided on the lower surface of a top layer of transparent support material 12 such as glass, and a plurality of sectors (counter electrodes) represented by sectors S11, S5, S1 and S7, which may be provided on the top surface of a lower layer of support material 14 which may also be glass.

Figure 2:
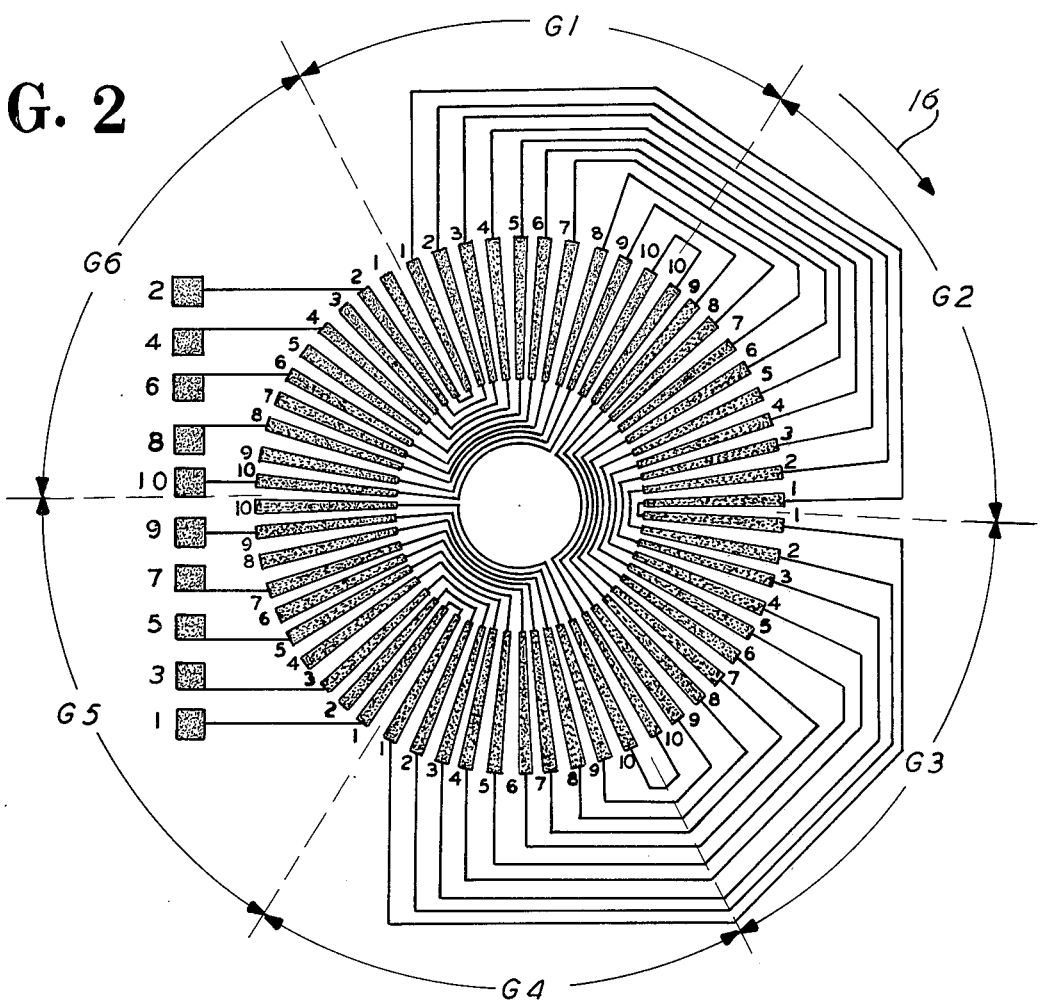
FIG. 2 is a top view of the segments showing the manner of their disposition and series electrical interconnections in accordance with the teaching of the present invention.
Figure 3:
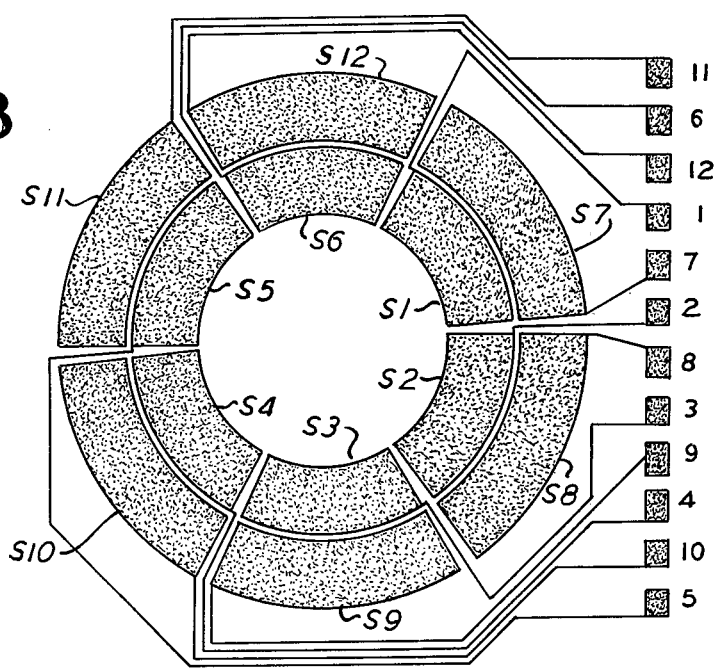
FIG. 3 is a top view of the sectors showing their disposition and electrical interconnection in accordance with the teaching of the present invention.

For convenience of electrical interconnecting, all the input leads to the segments may be all brought out to one side of the display as is represented by input lead 8 numbered correspondingly to segment 8, and all of the input leads to the sectors may be brought out to the other side of the display (this disposition of segment and sector input leads may also be seen in FIGS. 2 and 3). The analog display of FIG. 1 may further include a body of liquid crystal material disposed between the segments and sectors and which liquid crystal material, as understood by those skilled in the art, has the capability of being in a first optical state, such as a light scattering state, and a capability of being changed into a second optical state, such as a transparent state, upon an electric field being established thereacross by electrical input signals being provided to the segments and the sectors. It will be further understood by those skilled in the art that the analog display of the present invention may be operated in either the reflective or transmissive modes and may also be operated in either the dynamic light scattering mode or the field effect mode. The segments, sectors and input leads thereto, may be formed on the respective support layer surfaces by sputtering, evaporation, photo-masking, or etching and the segments may be made of a suitable transparent electrically conductive reflective or transparent material depending upon whether the display is operated in the reflective or transmissive modes—all in a manner known to those skilled in the liquid crystal display art.

Referring now to FIGS. 2 and 3, and in particular to FIG. 2, there is shown a plurality of groups of segments G1 . . . G6 which are disposed adjacent to each other arcuately and in a predetermined pattern such as the shown circular pattern; however, it will be understood by those skilled in the art that, in accordance with the teachings of the present invention such segments and groups of segments could be disposed in a straight line so as to provide, for example, a bar graph. It will be noted with particularity, and as shown in FIG. 2, that the segments in each group are disposed in a sequence opposite to the sequence in which the segments of the next adjacent groups are disposed, namely, as shown each group of segments in the specific embodiments of the present invention illustrated includes ten segments which are numbered one to ten with the segments in group G1 being disposed arcuately 1, 2, 3 . . . 10 whereas the segments in the next adjacent groups G2 and G6 are disposed in an opposite sequence, namely, 10, 9, 8 . . . 1; such sequential disposition being relative to a predetermined direction of liquid display movement such as the clockwise direction of movement as indicated by the clockwise arrow 16 at the upper portion of FIG. 2. Further, as shown in FIG. 2, it will be noted that each segment in each group of segments is associated with one of the segments in each of the other groups, for example, it will be noted by way of example that each group of segments includes a segment 1 and thus all segments 1 of all groups correspond and it will be further noted that all segments 1 of all groups are electrically interconnected in series and thus only one input lead is required for all corresponding segments of all groups and, by way of further example, the input lead to all corresponding segments 1 of all groups is brought out to the left and identified numerically as 1. Accordingly, it will be understood that a minimization of input leads is accomplished in that only one input lead is required for all corresponding segments of all groups and thus only ten input leads for the 60 segments of FIG. 2 are required in the specific embodiment of the invention shown, and, it will be noted that there are no cross-over points whatsoever of the leads to the 60 segments.

Referring now to FIG. 3, it will be noted as shown that there is provided in accordance with the shown embodiments of the invention a first plurality of radially disposed sectors S7 . . . S12 arranged in a circular pattern, and a second plurality of radially disposed sectors S1 . . . S6, also arranged in a circular pattern and disposed concentrically within and aligned angularly with the first plurality of sectors. It will be further understood that the segments of FIG. 2 are to overlie and be disposed opposite to and spaced from the pluralities of concentric sectors shown in FIG. 3, such that the first plurality of sectors S7 . . . S12 are displaced opposite to substantially the radially outer one-half portion of the segments of FIG. 2 and that the second plurality of radially disposed sectors S1 . . . S6 are disposed opposite to and displaced from substantially the radially inner one-half portion of the segments.

Still further, it will be understood that the sectors S12 and S6 are disposed opposite to and displaced from the segments of group G1 and that the sectors S3 and S9 are disposed opposite to and displaced from the segments of group G4, and that the other sectors and groups of segments are correspondingly oppositely disposed and spaced apart. Further, it will be understood that the body of liquid crystal material LC shown in FIG. 1 is disposed between the plurality of groups of segments and the pluralities of sectors.

As is further shown in FIG. 3, and FIG. 1, a plurality of input leads numerically designated 1 . . . 12 are provided with each of the input leads being connected to one of the sectors of one of the circularly disposed pluralities of sectors.

Referring now to the general operation of the specific embodiment of the analog liquid crystal display of the present invention illustrated in FIGS. 2 and 3, upon a suitable input electric signal being applied to segment input lead 1 and upon a suitable electric input signal being simultaneously applied to input lead 12 of sector S-12, the portion of liquid crystal material disposed between the radially outer one-half portion of segment 1 of group G1 and sector 12 will be changed from the first optical state into the second optical state thereby providing an optically visible display, and accordingly, upon the input signals to the segments next being applied next in sequence to segment input lead 2 and upon the input signal to both sectors 12 and 6 being simultaneously applied, that portion of liquid crystal material between both the radially inner and outer one-half portions of segment 2 of group G1 and sectors 12 and 6 will be changed from the first optical state into the second optical state, and so forth, for each portion of liquid crystal material disposed between either the radially inner or outer one-half, or both, of one of the segments and one or two of the sectors to which segment and sector or sectors input signals are simultaneously applied. Further, it will be understood that upon suitable multiplexing signals being applied to the segments of FIG. 2 and the sectors of FIG. 3 as disclosed in U.S. Pat. No. 3,789,388 issued Jan. 27, 1964, that although the multiplex input signals to the segments and sectors are applied respectively sequentially, but simultaneously with regard to opposed segments and sectors, due to the multiplexing rate of input signal application, those portions of the body of liquid crystal material disposed between the predetermined segments and sectors will appear to be constantly changed from the first optical state into the second optical state thereby providing what appears to the eye of a human observer to be a constantly or steady state "illuminated" display.

It will be further noted that the analog liquid crystal display for being multiplexed of the present invention disclosed in FIGS. 2 and 3 has been structured to provide the analog display for a timepiece, such as a wristwatch, wherein there would be displayed a long minute hand equal to the entire radial length (both the radially inner and outer one-halves) of an entire segment, a sweep second hand also equal in length to the entire radial length of the segments and a short hour hand equal in length to substantially the radially inner one-half portion of the segments—the minute hand and the sweep second hand being easily distinguishable in that the duty length of the multiplexed input signals providing the minute hand would be of a minute's duration or multiplex "duty" rate of one minute and the multiplexed input signals providing the sweep second hand would be of a second's duration or have a multiplex "duty" rate of one second. Thus, were it desired to display a minute at the position of segment 5 of Gl, an input signal would be applied to segment input lead 5 of FIG. 2 and simultaneously an input signal would be applied to both sector S12 and S6 by applying input signals to their respective input leads 12 and 6 of FIG. 3. Should it be desired to display a second at segment 4 of group G3, a segment input signal would be applied to segment input lead 4 of FIG. 2 and simultaneously input signals would be applied to sector input leads 2 and 8 of FIG. 3 and thus to sectors S2 and S8, whereby, that portion of liquid crystal material disposed between segment 4 of group G3 and sectors S2 and S8 would be changed from the first optical state into the second optical state. Similarly, should it be desired to display an hour at segment 7 of group G6, a segment input signal would be applied to segment input lead 7 of FIG. 2 and simultaneously a sector input signal would be applied to sector input lead S5 and thus to sector S5, and hence, the radially inner one-half portion of liquid crystal material residing between segment 7 of group G6 and sector S5 would be changed from the first optical state into the second optical state.

Figure 4:
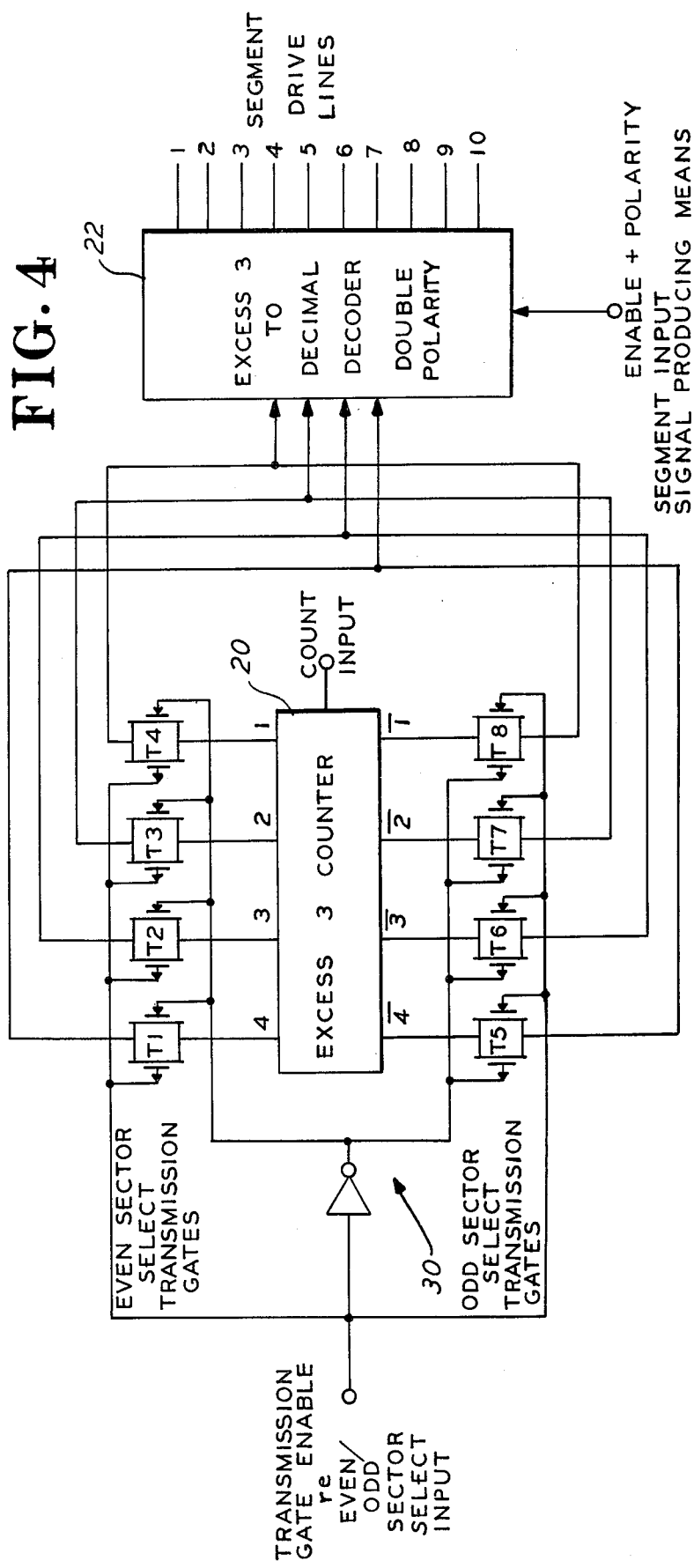
FIG. 4 is a schematic diagram of segment input signal producing means for alternately providing the input signals to the segments in a first sequence and alternately in an opposite sequence.

Referring now to FIG. 4, there is shown schematically segment input signal producing means for providing the input signals to the segments of groups G1 . . . G6 in a first sequence with regard to the clockwise arrow 16 of FIG. 2, that is, in the sequence of 1 . . . 10, and for alternately applying the input signals to the segment input leads in the opposite sequence with regard to the clockwise direction, for example, in the segment sequence 10 . . . 1.

Such segment input signal producing means including an excess 3 counter 20 having two sets of binary output leads, set 4 3 2 1 and set $\overline{4}\,\overline{3}\,\overline{2}\,\overline{1}$, as shown. Such excess 3 counter, as knonwn to those skilled in the art, provides simultaneously two sets of binary output signals at the sets of binary output leads with each set of binary signals being the complement of the other. More specifically, the binary output signal provided at binary output leads 4 3 2 1 will be an ascending count, for example, from 0 to 9, and the binary output signal at binary output leads $\overline{4}\,\overline{3}\,\overline{2}\,\overline{1}$ will be a descending count, for example, from 9 to 0 — the excess 3 counter being stepped one count at a time in response to a count input signal being received at the input thereof where shown.

The segment input signal producing means further includes an excess 3 to decimal decoder having a plurality of output leads 1 . . . 10 equal in number to and for being connected to the segment input leads 1 . . . 10 shown in FIG. 2. The excess 3 to decimal decoder is also provided with a plurality of input leads connected to both sets of binary output leads of the excess 3 counter as is also shown; such decoder being known in the art.

Also included in the segment input signal producing means are two sets of transmission gates T1 . . . T4 and T5 . . . T8, respectively, which are connected between the binary output leads 4 3 2 1 and $\overline{4}\,\overline{3}\,\overline{2}\,\overline{1}$ and the input leads to the excess 3 to decimal decoder respectively. Further included are transmission gate enabling and disabling means, indicated by general numerical designation 30, connected to both sets of transmission gates, as shown, and for alternately enabling and disabling the respective sets of transmission gates in response to the receipt of an enable signal at the input thereof where shown.

As may be noted from FIGS. 2 and 4, in the specific embodiment of the invention shown, the even sectors receive input signals at which time the input signals to the segments are provided in the signal sequence 1 . . . 10 and that the odd numbered sectors receive input signals at the time the input signals to the segments are provided in the opposite sequence, namely, 10 . . . 1. Hence, as shown in FIG. 4, the even sector select transmission gates T1 . . . T4 are enabled upon an input signal being provided to an even numbered sector whereupon the ascending binary count from the excess 3 counter will be connected to the excess 3 to decimal decoder and decoded thereby to provide the input signals to the segments in the sequence 1 . . . 10; conversely, odd sector select transmission gates T5 . . . T8 are enabled upon an input signal being provided to the odd numbered sectors whereby the descending binary count from the excess 3 counter is connected to the excess 3 to decimal decoder and decoded thereby to provide the opposite signal sequence to the inputs of the segments, namely, the descending count 10 . . . 1. It will be further appreciated by those skilled in the art that the enable input signal to the excess 3 to decimal decoder, the count input signals to the excess 3 counter and the input to the gate enabling and disabling means 30 is provided by suitable means in timed sequence depending upon the display rate or duty cycle desired for the analog display of the present invention. It will be further noted, and as is within the skill of those skilled in the decoder art, that the excess 3 to decimal decoder may be equipped for double polarity operation in response to a signal at the enable plus polarity input whereby the signals provided to the segments may be alternately reversed in polarity to prolong the life of the liquid crystal material.

The input signals to the sectors of FIG. 3 may be provided, for example, by such circuitry as that shown in FIG. 6 of the above-identified U.S. Pat. No. 3,789,388.

It will be further understood by those skilled in the art that while the specific embodiment of the present invention is particularly useful as an analog liquid crystal display for being operated under multiplexed conditions as a display for a timepiece, namely a wristwatch, that the additional circuitry required to provide the signals to the segments to provide a display of seconds, minutes and hours is not a part of this invention but is within the skill of one of ordinary skill in the art.

It will be further understood by those skilled in the art that many modifications and variations may be made in the present invention without departing from the spirit and the scope thereof.

What is claimed is:

1. Analog display utilizing liquid crystal material and for being multiplexed, comprising:
   a plurality of groups of segments disposed adjacent to each other in a predetermined pattern, with regard to a predetermined direction, the segments in each group being disposed of in a sequence opposite to the sequence in which the segments of the next adjacent group are disposed, and each segment in each group corresponding to one of the segments in each of the other groups and all corresponding segments in all groups being connecting electrically in a series connection;
   a plurality of sectors disposed adjacent to each other and in said predetermined pattern, each of said sectors disposed opposite to one of said groups of segments and displaced therefrom;
   a body of liquid crystal material disposed between said plurality of groups of segments and said sectors;
   a first plurality of input leads, each of said input leads being connected electrically with one of said series connections of said corresponding segments; and
   a second plurality of input leads, each of said input leads being connected electrically to one of said sectors, wherein said body of liquid crystal material is in a first optical state and wherein each portion of said body of liquid crystal material disposed between one of said segments and one of said sectors is capable of changing into a second optical state upon an electric field being established thereacross by a first input signal being applied to said one segment and by a second input signal being applied to said one sector, and said analog display further comprising;
   means for applying first input signals to said first plurality of input leads in a first predetermined sequence with regard to said predetermined direction upon a second input signal being applied to a predetermined one of said sectors, and for applying said first input signals to said first plurality of input leads in a sequence opposite to said first predetermined sequence and with regard to said predetermined direction upon said second input signal being applied to the sector next adjacent to said predtermined one of said sectors whereby the portions of said body of liquid crystal material disposed between said segments and said sectors change from said first optical state into said second optical state sequentially in said predetermined direction.

2. Analog display for a timepiece, said display utilizing liquid crystal material and for being multiplexed, comprising:
   a plurality of groups of radially extending segments, said groups of segments arranged in a circular pattern and each set of segments being arcuately adjacent two other groups of segments, with regard to a predetermined circular direction the segments in each group being disposed arcuately in a sequence opposite to the arcuate sequence in which the segments of the two next adjacent groups of segments are disposed, each segment in each group corresponding to one of the segments in each of the other groups and all corresponding segments in all groups being connected electrically in a series connection, and said segments having a radially outer one-half portion and a radially inner one-half portion;
   a first plurality of radially disposed sectors arranged in a circular pattern, each of said sectors disposed opposite to and displaced from substantially said radially outer one-half portion of the segments of one of said groups of segments;
   a second plurality of radially disposed sectors arranged in a circular pattern concentrically within and aligned angularly with said first plurality of sectors, each of said sectors being disposed opposite to and displaced from substantially said radially inner one-half portion of the segments of one of said groups of segments;
   a body of liquid crystal material disposed between said plurality of groups of segments and said pluralities of sectors;
   a first plurality of input leads, each of said input leads being connected electrically to one of said series connections of said corresponding segments;
   a second plurality of input leads, each of said input leads being connected electrically to one of said sectors of one of said pluralities of sectors, wherein said body of liquid crystal material is in a first optical state and wherein each portion of said body of liquid crystal material disposed between substantially said radially inner or radially outer one-half portion of one of said segments and one of said sectors is capable of changing into a second optical state upon an electric field being established thereacross by a first input signal being applied to said one segment and by a second input signal being applied to said one sector, and further comprising;
   segment input signal producing means for applying first input signals to said first plurality of input leads in a first predetermined signal sequence with regard to said predetermined circular direction upon a second input signal being applied to a predetermined one of said sectors, and said segment input signal producing means for applying said first input signals to said first plurality of input leads in a signal sequence opposite to said first predetermined signal sequence upon said second input signal being applied to the sector next adjacent to said predetermined one of said sectors with regard to said predetermined circular direction whereby said portions of said body of liquid crystal material disposed between said radial one-halves of said segments and said sectors change from said first optical state into said second optical state sequentially and in said predetermined circular direction.

3. Analog display according to claim 2 wherein said segment input signal producing means comprises:
   an excess 3 counter having two sets of binary output leads and for simultaneously providing a set of binary output signals at each set of binary output leads, the set of binary output signals provided at each set of binary output leads being the complement of the set of binary signals provided simultaneously at the other set of binary output leads, and, having a count input lead and upon the receipt of a predetermined input count signal at said count input lead said excess 3 counter being stepped one count;
   an excess 3 to decimal decoder having a plurality of output leads equal in number to and connected to said first plurality of input leads, and having a set of binary signal input leads;
   two sets of transmission gates, one of said sets of transmission gates connected between one of said sets of binary output leads of said excess 3 counter and said set of binary signal input leads of said excess 3 to decimal decoder, and the other of said sets of transmission gates connected between the other of said sets of binary output leads of said excess 3 counter and said set of binary signal input leads of said excess 3 to decimal decoder;
   transmission gate enabling and disabling means connected to both of said sets of transmission gates and for alternately enabling and disabling said sets of transmission gates in response to the receipt of a predetermined enable signal; and
   upon one of said sets of transmission gates being enabled one of said sets of binary output signals being transmitted to said excess 3 to decimal decoder and decoded thereby to provide said first input signals in said first predetermined signal sequence, and upon the other set of said sets of transmission gates being enabled the other of said sets of binary output signals complementary to said one set of binary output signals being connected to said excess 3 to decimal decoder and decoded thereby to provide said first input signal to said first plurality of input leads in said signal sequence opposite to said first predetermined signal sequence.

* * * * *